US012581983B2

(12) United States Patent
Bastos Abibe et al.

(10) Patent No.: US 12,581,983 B2
(45) Date of Patent: Mar. 17, 2026

(54) SEMICONDUCTOR MODULE COMPRISING A SEMICONDUCTOR AND COMPRISING A SHAPED METAL BODY THAT IS ELECTRICALLY CONTACTED BY THE SEMICONDUCTOR

(71) Applicant: Danfoss Silicon Power GmbH, Flensburg (DE)

(72) Inventors: André Bastos Abibe, Flensburg (DE); Frank Osterwald, Flensburg (DE); Jacek Rudzki, Flensburg (DE); Martin Becker, Flensburg (DE); Ronald Eisele, Flensburg (DE); David Benning, Flensburg (DE)

(73) Assignee: DANFOSS SILICON POWER GMBH, Flensburg (DE)

( * ) Notice: Subject to any disclaimer, the term of this patent is extended or adjusted under 35 U.S.C. 154(b) by 551 days.

(21) Appl. No.: 17/608,770

(22) PCT Filed: Apr. 30, 2020

(86) PCT No.: PCT/EP2020/062051
§ 371 (c)(1),
(2) Date: Nov. 4, 2021

(87) PCT Pub. No.: WO2020/225097
PCT Pub. Date: Nov. 12, 2020

(65) Prior Publication Data
US 2022/0302072 A1 Sep. 22, 2022

(30) Foreign Application Priority Data
May 8, 2019 (DE) ...................... 10 2019 111 963.4

(51) Int. Cl.
*H01L 23/00* (2006.01)

(52) U.S. Cl.
CPC .............. *H01L 24/40* (2013.01); *H01L 24/32* (2013.01); *H01L 24/37* (2013.01); *H01L 24/48* (2013.01);
(Continued)

(58) Field of Classification Search
CPC ... H01L 24/40; H01L 23/49833; H01L 24/29; H01L 24/32; H01L 24/48; H01L 24/73;
(Continued)

(56) References Cited

U.S. PATENT DOCUMENTS

2002/0005578 A1 1/2002 Kodama et al.
2003/0132041 A1 7/2003 Beihoff et al.
(Continued)

FOREIGN PATENT DOCUMENTS

CN 104779228 * 7/2015 ........... H01L 23/373
CN 104779228 A 7/2015
(Continued)

OTHER PUBLICATIONS

International Search Report for PCT/EP2020/062051 Dated Jul. 29, 2020.
(Continued)

*Primary Examiner* — Robert G Bachner
(74) *Attorney, Agent, or Firm* — McCormick, Paulding & Huber PLLC

(57) ABSTRACT

Semiconductor module including a semiconductor and including a shaped metal body that is electrically contacted by the semiconductor, for forming a contact surface for an electrical conductor, wherein the shaped metal body is bent or folded. A method is also described for establishing electrical contacting of an electrical conductor on a semiconductor, said method including the steps of: fastening a bent or folded shaped metal body of a constant thickness to the semiconductor by means of a first fastening method and
(Continued)

then fastening the electrical conductor to the shaped metal body by means of a second fastening method.

20 Claims, 3 Drawing Sheets

(52) U.S. Cl.
CPC .............. *H01L 24/73* (2013.01); *H01L 24/83* (2013.01); *H01L 24/84* (2013.01); *H01L 24/85* (2013.01); *H01L 2224/32058* (2013.01); *H01L 2224/32059* (2013.01); *H01L 2224/32245* (2013.01); *H01L 2224/37124* (2013.01); *H01L 2224/37147* (2013.01); *H01L 2224/4001* (2013.01); *H01L 2224/4007* (2013.01); *H01L 2224/40091* (2013.01); *H01L 2224/40095* (2013.01); *H01L 2224/40245* (2013.01); *H01L 2224/48011* (2013.01); *H01L 2224/48245* (2013.01); *H01L 2224/73213* (2013.01); *H01L 2224/73221* (2013.01); *H01L 2224/8382* (2013.01); *H01L 2224/8384* (2013.01); *H01L 2224/84205* (2013.01); *H01L 2224/84207* (2013.01); *H01L 2224/85203* (2013.01); *H01L 2224/8582* (2013.01); *H01L 2224/8584* (2013.01); *H01L 2924/10272* (2013.01); *H01L 2924/30107* (2013.01)

(58) Field of Classification Search
CPC ......... H01L 24/83; H01L 24/84; H01L 24/85; H01L 2224/29139; H01L 2224/32225; H01L 2224/32245; H01L 2224/4001; H01L 2224/40091; H01L 2224/40095; H01L 2224/40225; H01L 2224/48011; H01L 2224/48245; H01L 2224/73213; H01L 2224/73221; H01L 2224/73263; H01L 2224/8384; H01L 2224/8484; H01L 2224/85203; H01L 2924/10272; H01L 2924/351; H01L 2924/37001; H01L 23/49517; H01L 24/05; H01L 24/33; H01L 2224/04026; H01L 2224/05624; H01L 2224/2612; H01L 2224/29005; H01L 2224/29011; H01L 2224/29012; H01L 2224/29015; H01L 2224/29016; H01L 2224/29017; H01L 2224/29018; H01L 2224/29019; H01L 2224/29144; H01L 2224/29147; H01L 2224/29155; H01L 2224/29169; H01L 2224/29294; H01L 2224/29339; H01L 2224/33181; H01L 2224/4813; H01L 2224/4846; H01L 2224/73265; H01L 2224/83191; H01L 2224/83193; H01L 2224/83201; H01L 2224/83203; H01L 2224/83209; H01L 2924/00014; H01L 2224/32227; H01L 2224/838; H01L 2224/83022; H01L 2224/83901; H01L 23/3735; H01L 23/49537; H01L 24/34; H01L 2224/4105; H01L 2224/84365

See application file for complete search history.

(56) References Cited

U.S. PATENT DOCUMENTS

| | | | |
|---|---|---|---|
| 2003/0168252 A1* | 9/2003 | Schmid | H01L 24/40 257/691 |
| 2008/0224282 A1 | 9/2008 | Ashida et al. | |
| 2012/0164767 A1* | 6/2012 | Gasse | H01L 27/153 257/E33.061 |
| 2017/0365583 A1 | 12/2017 | Im et al. | |
| 2019/0214369 A1 | 7/2019 | Seidemann et al. | |
| 2019/0371703 A1 | 12/2019 | Matsuzaki et al. | |

FOREIGN PATENT DOCUMENTS

| | | | |
|---|---|---|---|
| DE | 10 2014 219 585 A1 | 3/2016 | |
| DE | 10 2014 222 819 A1 | 5/2016 | |
| EP | 2372763 A2 | 10/2011 | |
| JP | 2006-294882 A | 10/2006 | |
| JP | 2007042738 A | 2/2007 | |
| JP | 2012-142622 A | 7/2012 | |
| TW | 200725853 A | 7/2007 | |
| WO | 2017218968 A2 | 12/2017 | |
| WO | 2019053840 A1 | 3/2019 | |

OTHER PUBLICATIONS

International Search Report for PCT/EP2020/062628 dated Sep. 10, 2020.
Office Action issued for German Patent Application Serial No. 102019111964.2, dated Jul. 18, 2022 and an English machine summary translation thereof.

* cited by examiner z y x

100

40

30

20

50

10

30 a.

50

30 b.

50

30 c.

50

SEMICONDUCTOR MODULE COMPRISING A SEMICONDUCTOR AND COMPRISING A SHAPED METAL BODY THAT IS ELECTRICALLY CONTACTED BY THE SEMICONDUCTOR

CROSS-REFERENCE TO RELATED APPLICATION

This application is a National Stage application of International Patent Application No. PCT/EP2020/062051, filed on Apr. 30, 2020, which claims priority to German Application No. 102019111963.4 filed on May 8, 2019, each of which is hereby incorporated by reference in its entirety.

TECHNICAL FIELD

The invention relates to a semiconductor module comprising a semiconductor and comprising a shaped metal body that is electrically contacted by the semiconductor, for forming a contact surface for an electrical conductor.

BACKGROUND

Conventional assembly methods for power modules are based on soldering the collector/drain side of the chip onto a substrate, while the respective emitter/source potentials of the upper face of said chip are connected to the substrate by means of aluminum wire connections. These methods have been found to be reliable in standard applications using silicon-based semiconductors.

Over the years, the power density of the chips has increased, with the result that the thermomechanical requirements of the assembly methods have increased. Other assembly methods have therefore been established for new high-power-density silicon semiconductor technologies. Silver sintering or diffusion brazing has been developed for the lower face of the chip. Copper wire bonding and soldering of clips has been developed for the upper face of the chip. Using these techniques ensures the reliability of silicon high-power IGBT modules.

Recently, the silicon carbide (SiC) technology for MOSFETs has developed to an economically attractive level. Owing to the high switching frequency thereof, SiC-based power modules require a low-inductance design.

A frequently described approach for meeting the SiC inductance requirements uses stacked systems in which the drain potential extends in parallel with the source potential in the Z-axis, instead of extending in the XY-plane. This is achieved for example by fastening an electrically conductive spacer on the upper face of the chip, and fastening a lead frame or DBC, as the source potential, on the upper face of said spacer.

However, most of the assembly methods currently available are not suitable for achieving the required inductance values for SiC power modules.

In view of the contact on the upper face, the wire bonding requires the source potential of the substrate to additionally be shifted laterally (in the XY-plane), as a result of which the conductor tracks, and thus the inductance, are increased. In addition, the wire length used contributes to increasing inductance of the conduction path.

A possible approach would be to use a welding method (e.g. ultrasonic or laser) for fastening a lead frame or terminal to the upper face of the chip. However, commercially available chip metallizations cannot withstand the stresses of ultrasonic welding and the energy input of laser welding for typical copper connectors. In the current form, both these processes would destroy the semiconductor.

A further approach of current methods would consist in sintering or soldering a spacer onto the chip and subsequently thereby attaching said chip to a lead frame or substrate, by means of sintering or soldering. However, this approach poses challenges for the tolerances transversely to the plane of the semiconductor chip, and for the tensions on the chip, owing to the large adhesion surfaces.

SUMMARY

The object of the invention is therefore that of providing a semiconductor chip comprising a contact surface for an electrical conductor, in particular for SiC-based power modules, to which chip an electrical conductor can be fastened by means of ultrasonic welding or laser welding.

This object is achieved according to the invention by the semiconductor module having the features of claim 1. Advantageous embodiments of the invention are set out in the dependent claims.

The requirement for connecting a source potential, such as a lead frame, to the upper face of a chip without using wires therefore consists in the chip needing to be able to withstand the stresses resulting from the selected joining process, and the method sequence needing to be technically and economically achievable.

The basic concept of the invention is accordingly that of using a particularly structured shaped metal body in order to protect the chip when a heavy-duty lead frame or ribbon is fastened to the upper face thereof. The main aim of a means of this kind is that the lead frame or the ribbon should connect the source potential of a SiC MOSFET into a weakly inductive source potential by means of the die-substrate assembly.

A structured shaped metal body is proposed as a suitable means for relieving tension on the chip upper face. Said shaped metal body preferably consists of copper or aluminum. The geometry thereof is preferably a pattern that can be produced by stamping, extruding or hot-working a metal sheet and creates a structure having the following properties:

elasticity in the X- or Y- and in the Z-direction;

a sufficient surface area for establishing electrical contact.

Depending on the application, the thickness t of said shaped metal sheet may be between 50 μm and 300 μm. The width and height of the shaped structures are application-specific, and the practicability thereof depends on the thickness of the shaped metal sheet.

When using copper, the shaped metal body formed according to the invention is preferably fastened to the semiconductor by means of silver sintering. This requires metallization of the upper face of the chip using noble metals. In structures that are for example similar to a square wave having a thick shaped metal body, not all the recesses in the shaped metal body need to be filled with silver paste, since the shaped metal body structure itself should withstand the stresses of the subsequent joining process.

When using an aluminum shaped metal body, using the structuring that is applied to the metal sheet may lead to local cracking of the aluminum oxide layers during pressing, making it possible to use standard aluminum metallization on the chip. An expedient design therefor consists in a configuration having sharp peaks, similar to a triangular wave. Said aluminum structures may, however, also be connected to the chip by means of a friction solder material ("friction solder").

Typical compositions for friction solder materials are:

L-SnZn10 (85-92% tin, remainder zinc)

L-SnZn40 (55-70% tin, remainder zinc)

L-CdZn20 (75-83% cadmium, remainder zinc)

L-ZnAl15 (84-86% zinc, remainder aluminum)

A shaped metal body formed according to the invention, and/or the fastening thereof to the chip, allows for the following properties and bonding processes:

1. Tension Relief on the Chip Upper Face:

A conventional spacer provides a large single connection to the chip upper face by means of a solid block. The structured shaped metal body according to the invention has a spring effect which reduces the thermomechanical shearing stresses at the chip upper face.

2. Ultrasonic Welding of Lead Frame or Ribbons:

Increasing the thickness of a conventional shaped metal body, and increased tension relief in the X-, Y- and Z-direction, owing to the field effect, makes it possible to carry out ultrasonic welding of copper connectors without damaging the chip.

3. Laser Welding of Lead Frame or Ribbons:

The shaped metal body formed according to the invention provides a greater vertical spacing from the semiconductor. Said vertical spacing should be designed such that the heat affected zone created by the laser welding does not damage the semiconductor.

Alternatively, connections may be made using electrically conducting nanowires. In this technique, nanowires may be grown from one or more of the surfaces to be connected, and then the surfaces are brought together. The joining takes place under compression and possibly with a raised temperature. However, the technique is admirably suited to the current invention, since it can successfully be used with relatively low pressures, thus enabling the connection of components utilizing the shaped metal body without damaging the elastic properties of the shaped metal body. The pressure used for bonding may be up to 70 MPa, but in some situations it may be as low as 1 MPa. The nanowires may typically comprise copper or gold, nickel, silver, platinum, or other suitable metals. Typically they may have a diameter of between 30 nm and 2 μm and have a length of between 500 nm and 50 μm.

Using one of these joining methods makes it possible to create a load current-capable path for the source potential in a plane in parallel with the collector plane, in which the chip is fastened, as a result of which a low-inductance design is achieved.

Therefore, according to the present invention, a semiconductor module is provided, comprising a semiconductor and comprising a shaped metal body that is electrically contacted by the semiconductor, for forming a contact surface for an electrical conductor, in which semiconductor module the shaped metal body is bent or folded. The shaped metal body thus extends in a substantially planar manner, but at the same time has a structure that is corrugated or folded in one direction. In this case, the wave troughs or wave peaks extend out of the plane of the shaped metal body. In this case, the thickness of the shaped metal body is constant over the length and width thereof; the shaped metal body is therefore bent or folded, in particular at a constant thickness.

The shaped metal body is preferably bent multiple times or folded multiple times. In particular, the shaped metal body is corrugated.

According to a further preferred embodiment, the shaped metal body consists of aluminum (Al) or copper (Cu).

In particular, the shaped metal body is connected to the semiconductor by means of sintering, adhesive bonding, soldering or by the use of nanowires.

In this case, the electrical conductor is preferably a lead frame or a ribbon.

The invention is advantageous in particular if the semiconductor is produced from silicon carbide (SiC) at least in part.

Finally, a method for establishing electrical contacting of an electrical conductor on a semiconductor is proposed, said method comprising the steps of: fastening a bent or folded shaped metal body of a constant thickness to the semiconductor by means of a first fastening method, and fastening the electrical conductor to the shaped metal body by means of a second fastening method.

The first fastening method is in particular sintering or by the use of nanowires, the second fastening method preferably being thermosonic bonding, ultrasonic bonding or by the use of nanowires.

The electrical conductor preferably used for the purpose of contacting is a lead frame or a ribbon. The semiconductor is preferably produced from silicon carbide (SiC) at least in part.

BRIEF DESCRIPTION OF THE DRAWINGS

The invention will be explained in greater detail in the following, with reference to a particularly preferred embodiment shown in the accompanying drawings. In the drawings.

DETAILED DESCRIPTION

Figure 1:
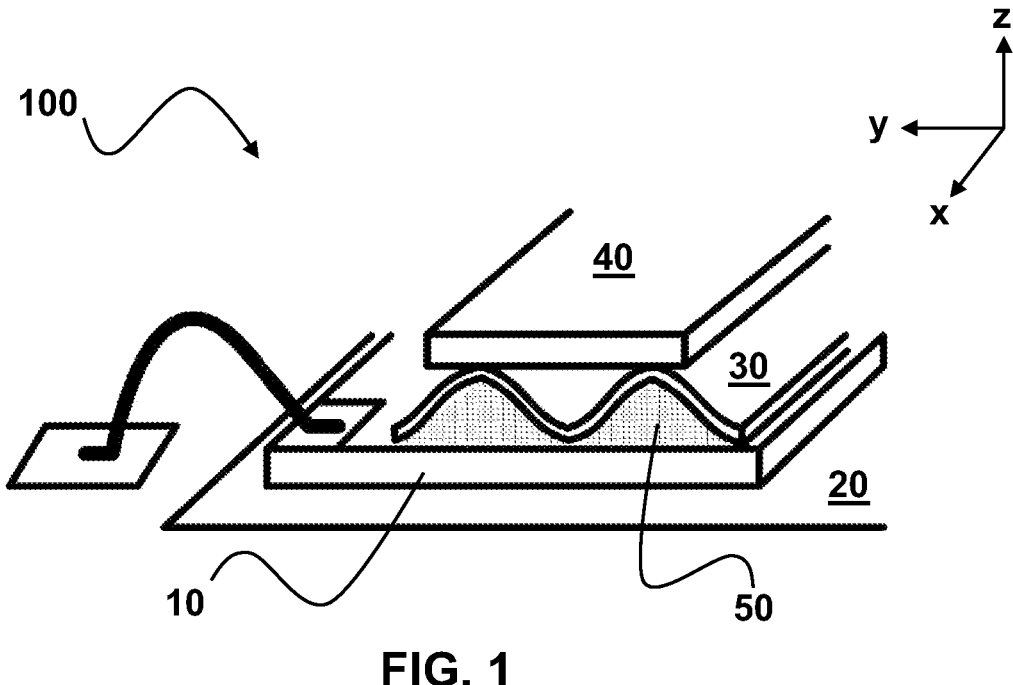
FIG. 1 is a perspective detail view of a particularly preferred embodiment of a semiconductor module according to the invention.

FIG. 1 is a perspective detail view of a particularly preferred embodiment of a semiconductor module according to the invention.

The semiconductor module 100 comprises a semiconductor 10 that is arranged on a substrate 20. A shaped metal body 30 which forms a contact surface for an electrical conductor 40 is arranged on the upper face of the semiconductor 10. In the example shown, the shaped metal body 30 is electrically conductively connected to the semiconductor 10 over the entire surface, by means of a connection layer 50, in particular a sintered layer. The semiconductor 10 and the shaped metal body 30 can be connected in a conventional manner, by means of sintering.

Alternatively, the semiconductor 10 and the shaped metal body 30 can be connected using electrically conducting nanowires. Such nanowires are grown from one or more of the surfaces to be connected, and then the surfaces are brought together. The joining takes place under compression and possibly with a raised temperature. However, the technique is admirably suited to the current invention, since it can successfully be used with relatively low pressures, thus enabling the connection of components utilizing the shaped metal body 30 without damaging the elastic properties of the shaped metal body 30. The pressure used for bonding may be up to 70 MPa, but in some situations it may be as low as 1 MPa. The nanowires may typically comprise copper or gold, nickel, silver, platinum, or other suitable metals. Typically they may have a diameter of between 30 nm and 2 μm and have a length of between 500 nm and 50 μm. A potential great advantage of the use of nanowires, is that the joint formed is flexible, and thus the stresses around the items being joined, such as a semiconductor chip or a substrate, is reduced. This in turn leads to much improved reliability and module life.

In this case, the shaped metal body 30 is elasticity elastically deformable in the X- or Y- and in the Z-direction and has a sufficient surface area for establishing electrical contact. In this case, the shaped metal body comprises a corrugated structure extending in the y-direction, as a result of which the shaped metal body also extends in the Z-direction.

Figure 2:
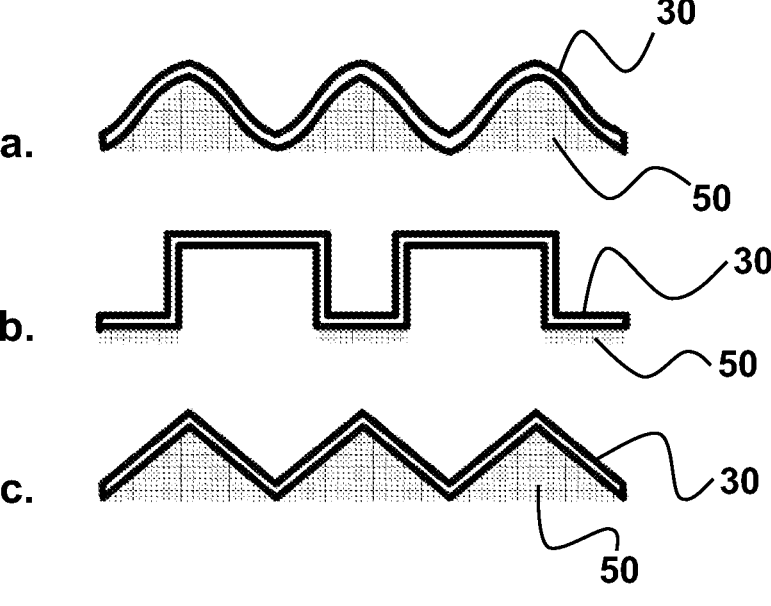
FIG. 2 is a side view of differently designed shaped metal body according to preferred embodiments.

FIG. 2 is a side view of differently designed shaped metal bodies 30 according to preferred embodiments. Metal shaped bodies that are designed in a preferred manner have a wavelike appearance similar to the designation of vibration modes of signals from the side or in cross section, in particular as a sine wave (a), a square wave (b) or a triangular wave (c). Alternatively, the shaped metal body 30 may also be formed in a manner similar to a sawtooth wave (not shown) in cross section.

Figure 3:
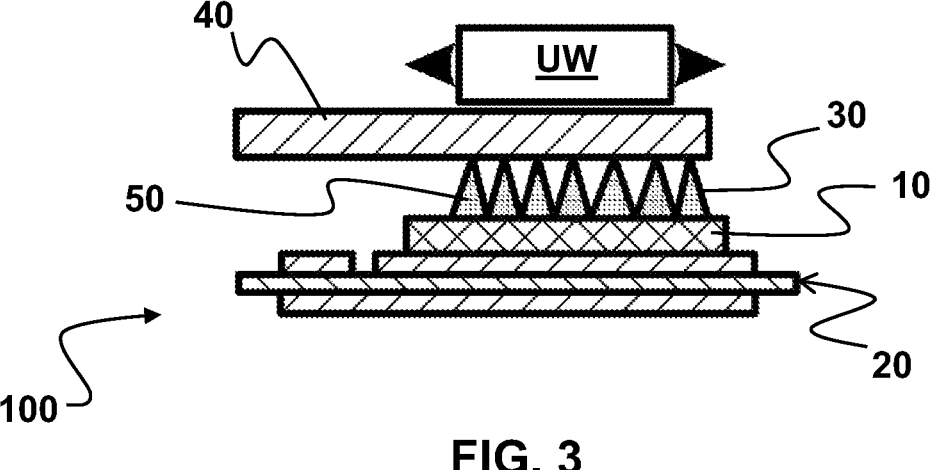
FIG. 3 is a schematic view illustrating the fastening of an electrical conductor to the shaped metal body formed according to the invention, by means of ultrasonic welding.

FIG. 3 is a schematic view illustrating the fastening of an electrical conductor to the shaped metal body formed according to the invention, by means of ultrasonic welding.

In particular, FIG. 3 shows a semiconductor module 100 comprising a semiconductor 10 that is arranged on a substrate 20 and carries a shaped metal body 30, designed in a particularly preferred manner, on the upper face thereof. The shaped metal body 30 is used to form a contact surface for an electrical conductor 40 which, in the example shown, is intended to be connected to the shaped metal body 30 by means of ultrasonic welding. In this case, the corrugated shaped metal body 30 functions as a buffer zone for mechanical stress caused by the ultrasonic welding UW process. This stress acts in the direction of the semiconductor 10, and can be absorbed by deformations in the shaped metal body 30, thus protecting the semiconductor 10.

Figure 4:
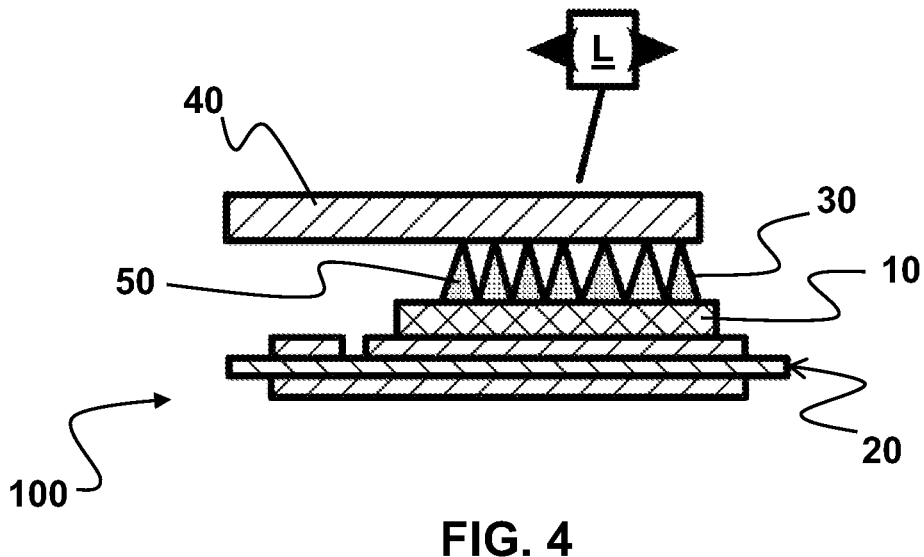
FIG. 4 is a schematic view illustrating the fastening of an electrical conductor to the shaped metal body formed according to the invention, by means of laser welding.

As an alternative, FIG. 4 is a schematic view illustrating the fastening of an electrical conductor to the shaped metal body formed according to the invention, by means of laser welding L. In the same structure of the semiconductor module 100, the shaped metal body 30 functions in this case as a thermal buffer zone in which the heat introduced by the laser welding can be dissipated without damaging the semiconductor 10.

Figure 5:
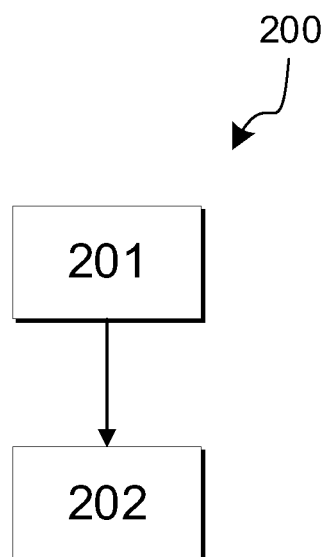
FIG. 5 is a flow chart illustrating the inventive method for establishing electrical contacting of an electrical conductor on a semiconductor.

FIG. 5 is a flow chart illustrating the inventive method 200 for establishing electrical contacting of an electrical conductor on a semiconductor. The said method 200 comprises the steps of:
1. fastening 201 a bent or folded shaped metal body of a constant thickness to the semiconductor by means of a first fastening method, and
2. fastening 202 the electrical conductor to the shaped metal body by means of a second fastening method.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A semiconductor module comprising a semiconductor and comprising a shaped metal body that is electrically contacted by the semiconductor for forming an electrically conducting contact surface for an electrical conductor,
   wherein the electrical conductor is stacked on top of the semiconductor,
   wherein the shaped metal body is bent or folded,
   wherein the bend or fold of the shaped metal body is located between a first surface of the semiconductor and an opposing surface of the electrical conductor,
   wherein the shaped metal body is connected to the first surface of the semiconductor by sintering, soldering, adhesive bonding or nanowires, and
   wherein the shaped metal body is connected to the opposing surface of the electrical conductor by ultrasonic welding, laser welding or thermosonic bonding.

2. The semiconductor module according to claim 1, wherein the shaped metal body is bent multiple times or folded multiple times.

3. The semiconductor module according to claim 1, wherein the shaped metal body is corrugated.

4. The semiconductor module according to claim 1, wherein the shaped metal body consists of aluminum (Al) or copper (Cu).

5. The semiconductor module according to claim 1, wherein the electrical conductor is a lead frame or a ribbon.

6. The semiconductor module according to claim 1, wherein the semiconductor is produced from silicon carbide (SiC), at least in part.

7. The semiconductor module according to claim 1, wherein the shaped metal body is electrically connected to the semiconductor over the entire surface of the shaped metal body facing the semiconductor.

8. The semiconductor module according to claim 1, wherein recesses formed in the shaped metal body and facing the semiconductor are filled with sintering, soldering, adhesive bonding material or nanowires.

9. A method for establishing electrical contacting between an electrical conductor and a semiconductor, said method comprising the steps of:
   first, fastening a bent or folded shaped metal body to the semiconductor by a first fastening method, and
   second, fastening the electrical conductor to the shaped metal body by a second fastening method,
   wherein the bend or fold of the shaped metal body is located between a first surface of the semiconductor and an opposing surface of the electrical conductor, and
   wherein the second fastening method includes ultrasonic welding, laser welding or thermosonic bonding.

10. The method according to claim 9, wherein the electrical conductor is a lead frame or a ribbon.

11. The method according to claim 9, wherein the semiconductor is produced from silicon carbide (SiC), at least in part.

12. The method according to claim 9, wherein the first fastening method includes sintering, soldering or adhesive bonding.

13. The method according to claim 9, wherein the first fastening method includes growing nanowires.

14. The method according to claim 9, wherein the shaped metal body is electrically connected to the semiconductor over the entire surface of the shaped metal body facing the semiconductor.

15. The method according to claim 9, wherein recesses formed in the shaped metal body and facing the semiconductor are filled with sintering, soldering, adhesive bonding material or nanowires.

16. A semiconductor module comprising a semiconductor and comprising a shaped metal body that is electrically contacted by the semiconductor for forming an electrically conducting contact surface for an electrical conductor, wherein the electrical conductor is stacked on top of the semiconductor, wherein the shaped metal body is bent or folded, wherein the bend or fold of the shaped metal body is located between a first surface of the semiconductor and an opposing surface of the electrical conductor, wherein the shaped metal body is connected to the semiconductor by nanowires, and wherein the shaped metal body is connected to the electrical conductor by nanowires.

17. The method according to claim 16, wherein the electrical conductor is a lead frame or a ribbon.

18. The semiconductor module according to claim 16, wherein the shaped metal body consists of aluminum (Al) or copper (Cu).

19. The semiconductor module according to claim 16, wherein the shaped metal body is electrically connected to the semiconductor over the entire surface of the shaped metal body facing the semiconductor.

20. The semiconductor module according to claim 16, wherein the nanowires are grown from one or more of the surfaces to be connected and then the surfaces are brought together.

\* \* \* \* \*